United States Patent [19]

Anderson et al.

[11] Patent Number: 5,216,265
[45] Date of Patent: Jun. 1, 1993

[54] INTEGRATED CIRCUIT MEMORY DEVICES WITH HIGH ANGLE IMPLANT AROUND TOP OF TRENCH TO REDUCE GATED DIODE LEAKAGE

[75] Inventors: Dirk N. Anderson; William R. McKee, both of Plano; Gishi Chung, Garland, all of Tex.

[73] Assignee: Texas Instruments Incorporated, Dallas, Tex.

[21] Appl. No.: 809,812

[22] Filed: Dec. 18, 1991

Related U.S. Application Data

[62] Division of Ser. No. 622,468, Dec. 5, 1990, Pat. No. 5,112,762.

[51] Int. Cl.[5] .................. H01L 29/68; H01L 29/78; H01L 29/92
[52] U.S. Cl. ............................ 257/301; 257/655
[58] Field of Search ............. 357/23.6 G, 55, 41; 437/60, 52

[56] References Cited

U.S. PATENT DOCUMENTS 5,017,506  5/1991  Shen et al. ......................... 437/60
5,057,887  10/1991  Yashiro et al. ................. 357/23.6 G Primary Examiner—Rolf Hille
Assistant Examiner—Robert Limanek
Attorney, Agent, or Firm—Stanton C. Braden; William E. Hiller; Richard L. Donaldson

[57] ABSTRACT

A method of reducing gated diode leakage in trench capacitor type field plate isolated dynamic random access memory devices is disclosed. The storage node of the capacitor is formed by placing a storage node material, such as implanted arsenic, into the trench walls of the device at a first tilt and a second tilt. The angle of the second tilt is preferably larger, higher, than the angle of the first tilt. This higher angle provides the storage node with a larger concentration of doping around the upper portion the trench walls. This larger concentration of doping reduces the charge leaking from the upper portion of the storage node into the substrate of semiconductor material. A trench type storage capacitor for a dynamic random access memory device is also disclosed.

6 Claims, 7 Drawing Sheets

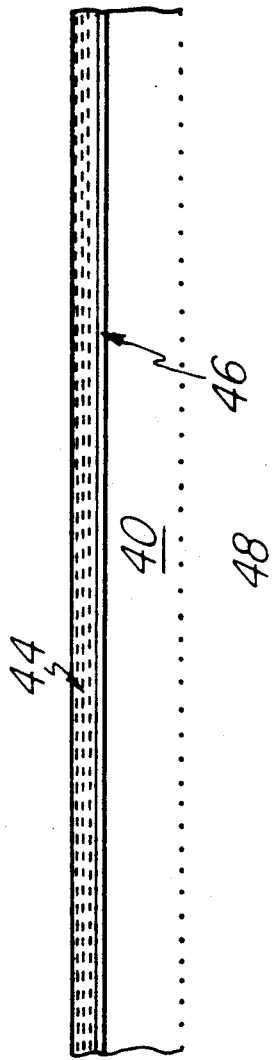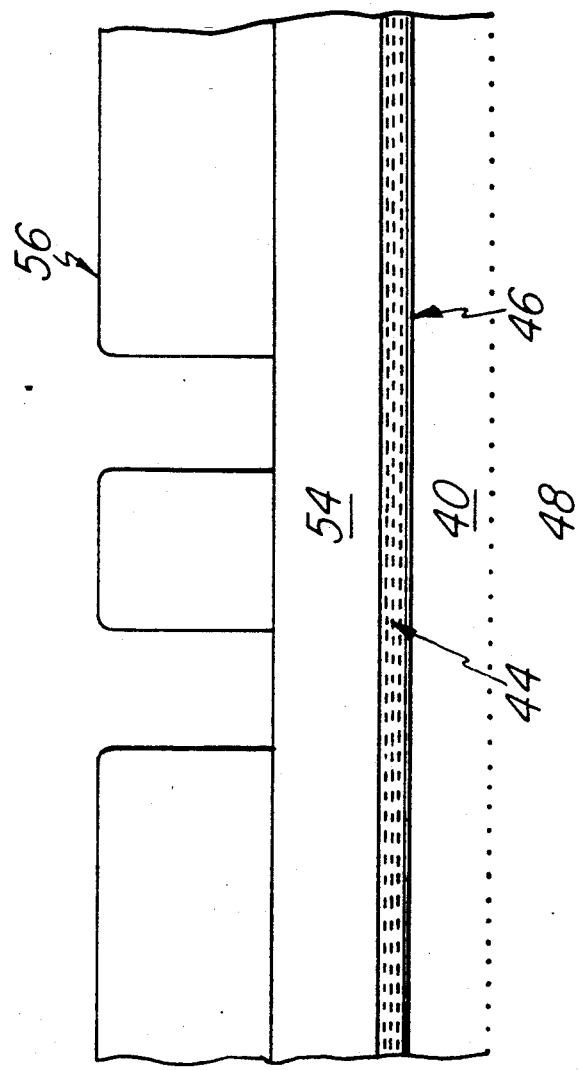

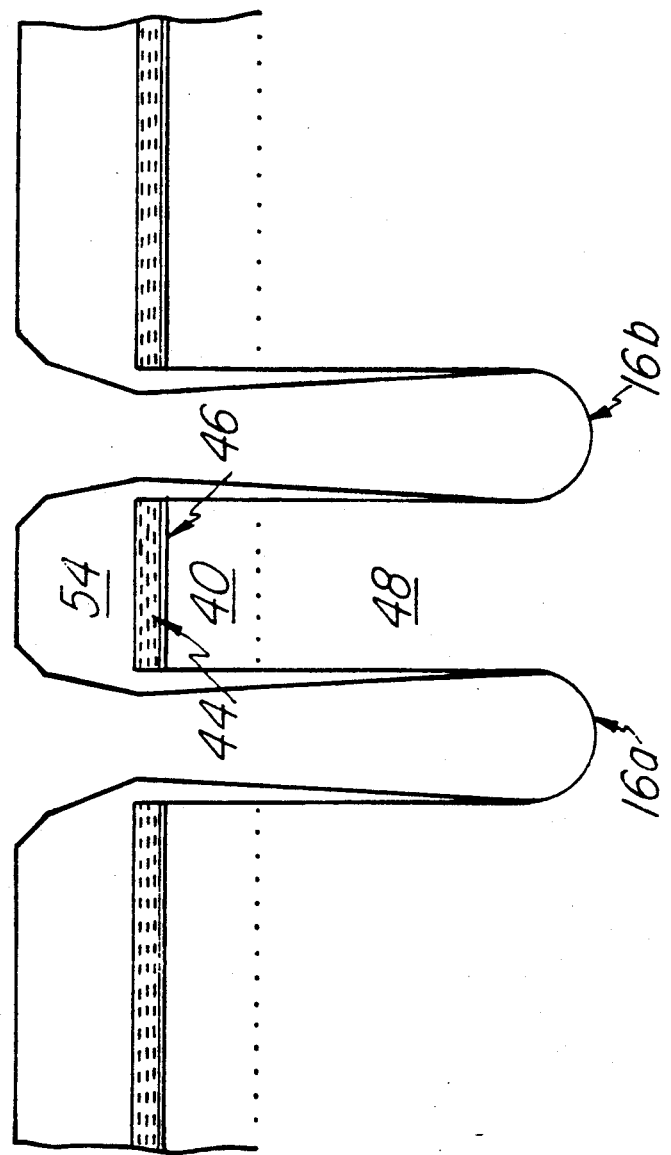

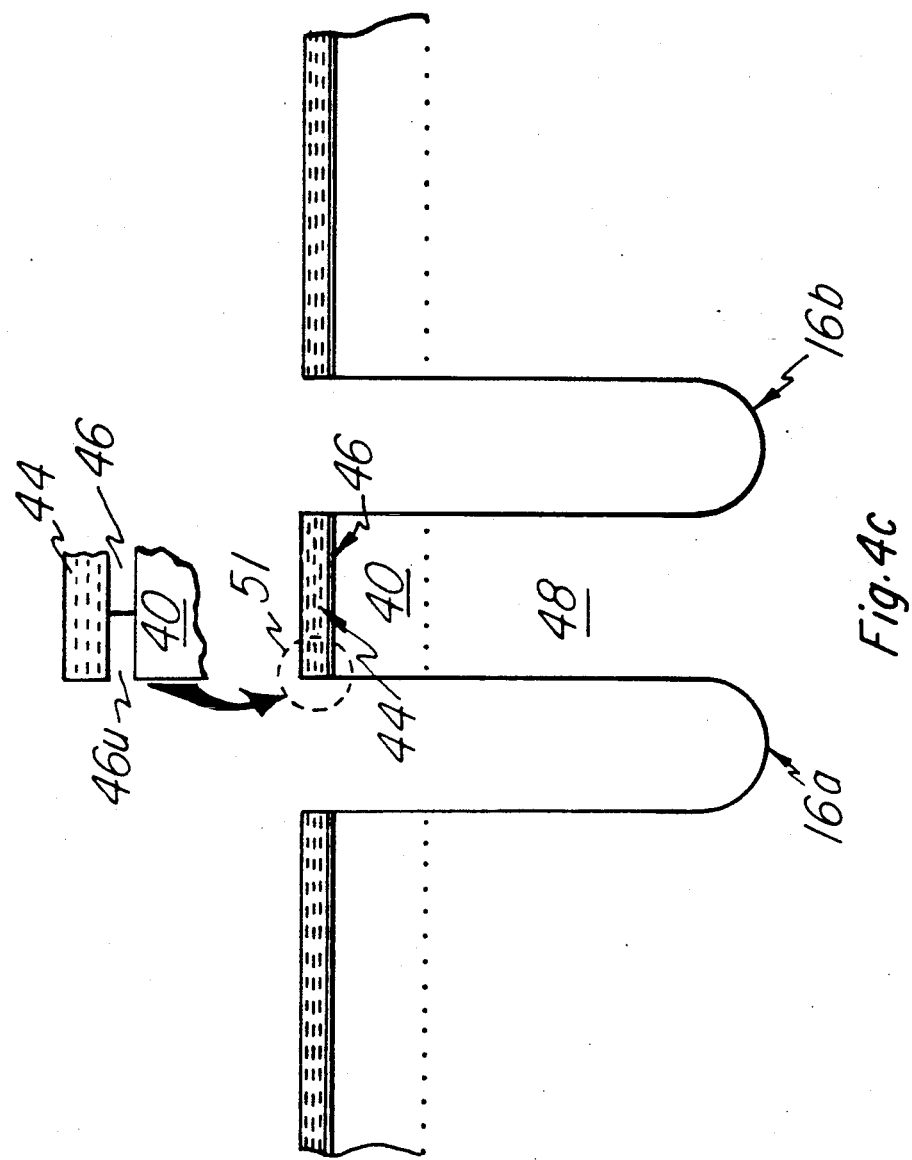

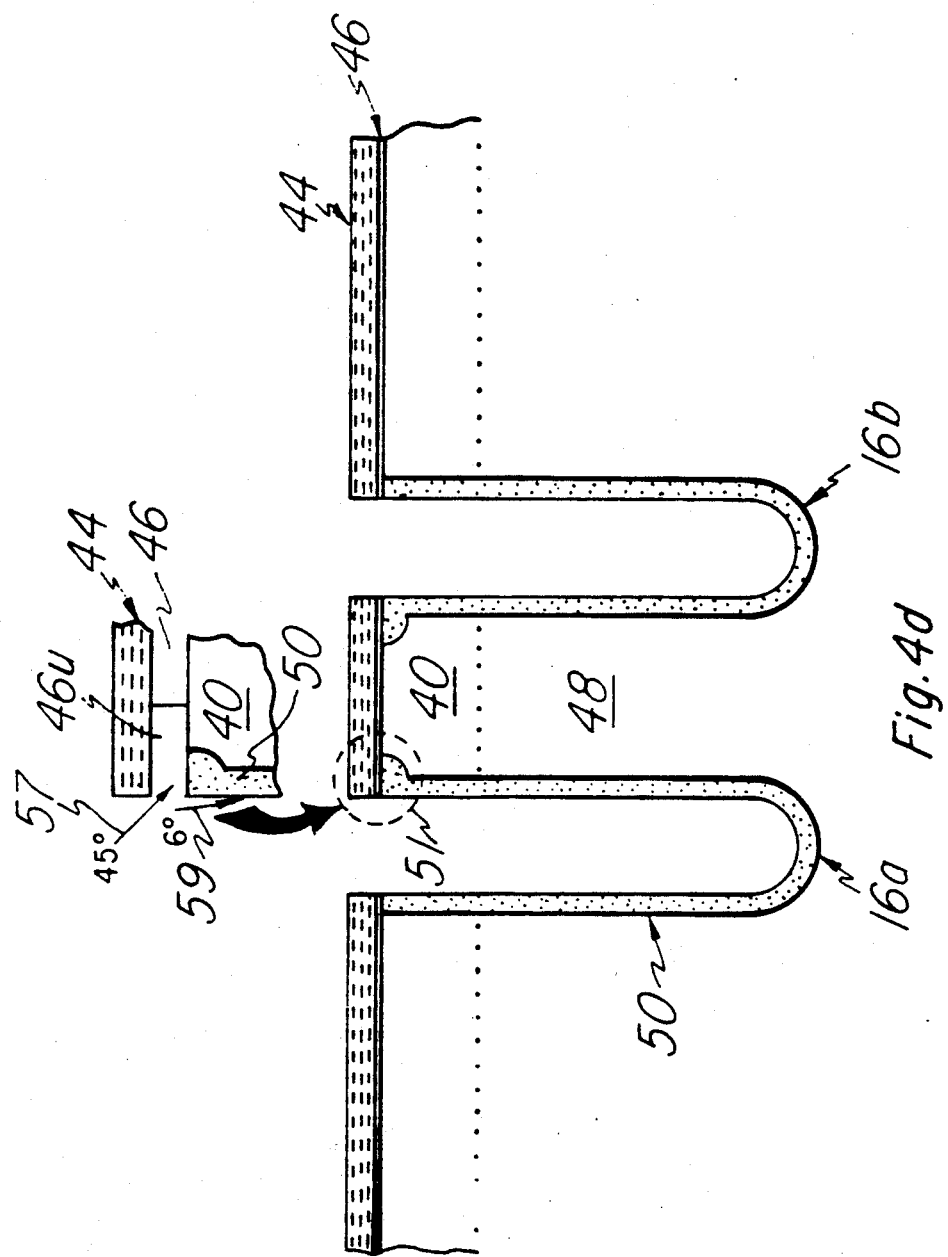

INTEGRATED CIRCUIT MEMORY DEVICES WITH HIGH ANGLE IMPLANT AROUND TOP OF TRENCH TO REDUCE GATED DIODE LEAKAGE

This is a division of application Ser. No. 07/622,468, filed Dec. 5, 1990, now U.S. Pat. No. 5,112,762 issued May 12, 1992.

FIELD OF THE INVENTION

The present invention relates to the field of integrated circuits and more specifically to integrated circuit memory devices having trench type capacitors.

BACKGROUND OF THE INVENTION

The quest to develop larger and larger semiconductors of the dynamic random access memory (DRAM) type is a well-known goal. The industry has steadily progressed from DRAMs of the 16K type, shown in U.S. Pat. No. 4,081,701 issued to White, McAdams and Redwine, and the 64K type, shown in U.S. Pat. No. 4,055,444 issued to Rao, to DRAMs of the 1M type, as described in U.S. Pat. No. 4,658,377 issued to McElroy. DRAMs of the 4M type are now being produced. Production plans for 16M DRAMs of submicron technology now exist and experimentation of 64M DRAMs has begun. One factor furthering the development of larger DRAMs is the reduction in memory cell geometries as illustrated in U.S. Pat. No. 4,240,092 to Kuo (a planar capacitor cell), and as illustrated in U.S. Pat. No. 4,721,987 to Baglee et al. (a trench capacitor cell). In a trench capacitor cell device, the capacitance of the device is increased by etching a groove, or trench, in the capacitance region. The trench capacitor cell of Baglee describes its upper plate as a polysilicon layer extending into the trench. This polysilicon layer extends over the face of the silicon bar to form field plate isolation over the face of the bar.

In developing DRAMs of the trench capacitor type, process engineers have observed a problem near the top of the trench they describe as "Gated Diode Leakage". This problem manifest itself through a leakage current. Current may flow through the upper portion of the storage node on the top of the trench wall edge into the silicon substrate by a band to band tunneling effect, thereby reducing the charge placed upon the storage node.

It is the object of this invention to provide a method to eliminate undesirable gated diode leakage near the top of the trench for trench capacitor type devices such as high density dynamic random access memories.

Other objects and advantages of the invention will be apparent to those of ordinary skill in the art having reference to the following specification, together with the drawings.

SUMMARY OF THE INVENTION

A method of reducing gated diode leakage in trench capacitor type field plate isolated dynamic random access memory devices is disclosed. The storage node of the capacitor is formed by placing a storage node material, such as implanted arsenic, into the trench walls of the device at a first tilt and a second tilt. The angle of the second tilt is preferably larger, higher, than the angle of the first tilt. This higher angle provides the storage node with a larger concentration of doping around the upper portion the trench walls. This larger concentration of doping reduces the charge leaking from the upper portion of the storage node into the substrate of semiconductor material. A trench type storage capacitor for a dynamic random access memory device is also disclosed.

BRIEF DESCRIPTION OF THE DRAWINGS

FIGS. 4–4d are cross sectional views of the of the trench capacitors 16a and 16b corresponding to FIG. 3 illustrating successive stages in the manufacture thereof.

DETAILED DESCRIPTION OF THE PREFERRED EMBODIMENT

Figure 1:
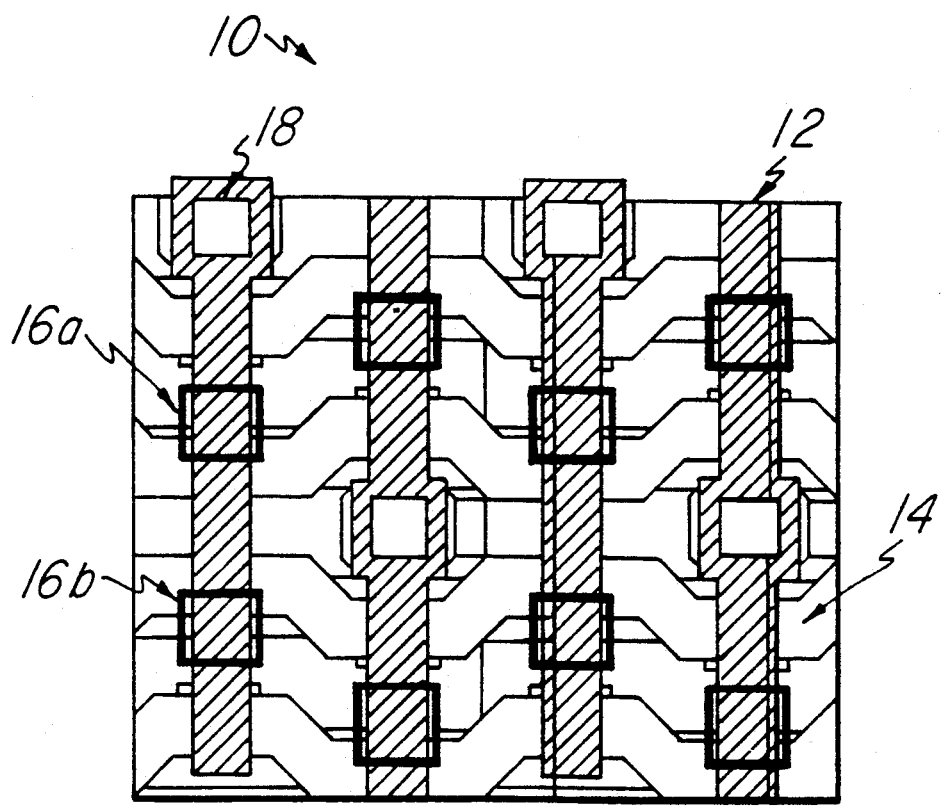
FIG. 1 is a top view of a portion of the memory array of a dynamic random access memory device, DRAM.

FIG. 1 illustrates a top view of a portion of a DRAM 10 memory array. The DRAM 10 may be a VLSI memory device of the so called 16 megabit size containing more than sixteen million memory cells on a single semiconductor substrate. The device contains bit lines 12 of poly-3 (TiSi$_1$) polycide, triple twisted for noise immunity. The word lines 14 are segmented poly-2, are strapped every 64 bits with metal-2. The DRAM 10 lays out the bit lines 12 and the word lines 14 in about a 1.6 um bit line pitch by about a 3.0 um double word line pitch pattern. The trench capacitors 16a and 16b contain a trench opening of about 0.8 um by 0.8 um, a trench to trench space of about 1.1 um, and a trench depth of about 6.0 um. The bit line contact 18 connects to a bit line 12 and to the drain of an unillustrated pass gate transistor 20.

Figure 2:
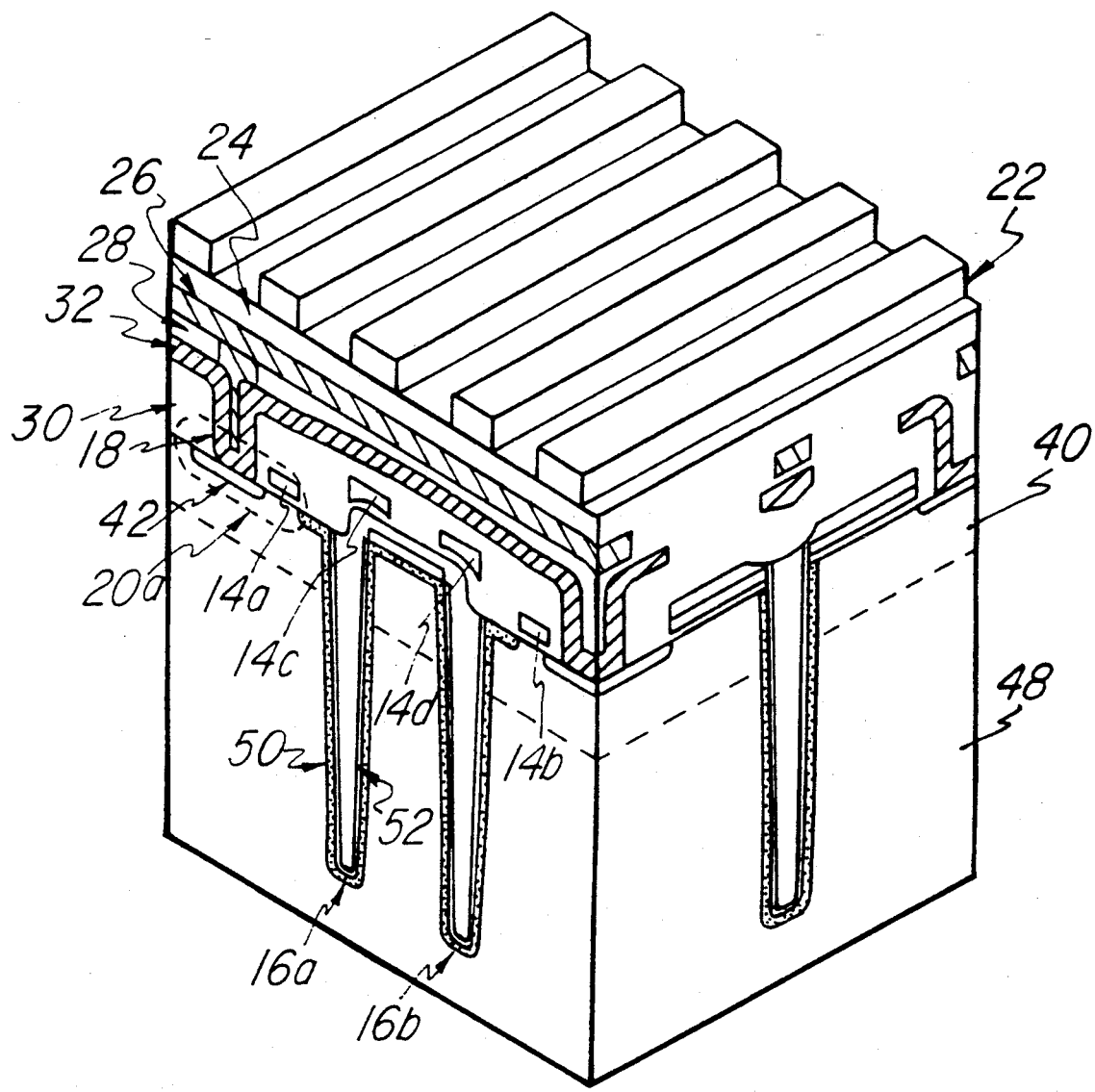
FIG. 2 is a three dimensional perspective view of a portion of the memory array of the DRAM of FIG. 1 containing the trench capacitors 16a and 16b.
Figure 3:
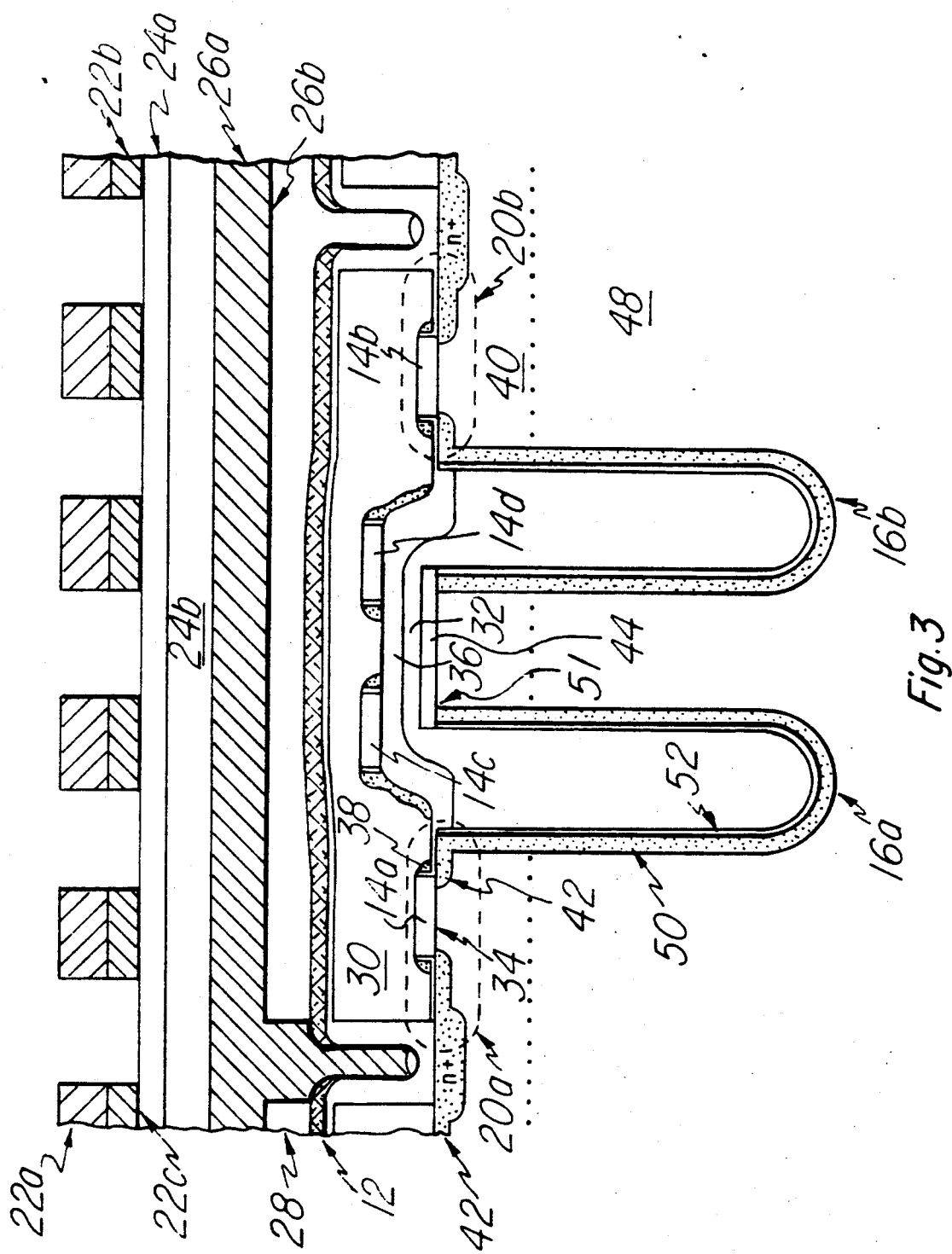
FIG. 3 is a cross sectional view of a portion of the memory array of the DRAM of FIG. 2 containing the trench capacitors 16a and 16b.

FIG. 2 presents a three dimensional view of a portion of FIG. 1 while FIG. 3 presents a cross section view. A three layer interconnect metal 22, Metal-2, accomplishes word line strapping. It has a top level 22a of Al-Si-Cu sputtered onto a middle level 22b of CVD W about 3500 A thick that overlies the bottom level 22C of sputtered TiW about 500 A thick. Oxide layer 24, lying beneath metal-2, is a metal interlevel oxide, MILO, of three layers: a top MILO level 24a of PECVD TEOS oxide about 3500 A thick; a middle level, unillustrated, of spin on glass, SOG; and, a lower MILO level 24b of PECVD TEOS oxide about 7000 A thick. A two level interconnect metal 26, Metal-1, lying beneath MILO-2 24 accomplishes contacts to bit lines. Its top layer 26a of chemical vapor deposited tungsten, CVD W, overlies its bottom layer 26b of sputtered TiW. In an alternative embodiment, interconnect metal layer 26 could consist of reacted titanium nitride. A multilevel oxide layer 28, MLO, lies below interconnect metal 26 to provide isolation between the silicided Poly-3 bitlines and Metal-1. A bit line oxide layer 30, BLO, lies beneath bit line 18, between bit line 18 and Poly-2 word lines 14. The poly-2 word lines 14 are about 0.6 microns wide. Poly-2 word line 14a forms the gate of pass transistor 20a and poly-2 word line 14b forms the gate of the pass transistor 20b for trench capacitor 16b. They are separated from the substrate by a Gate-2 oxide layer 34 about 150 A thick. Poly-2 word lines 14c and 14d pass over the top trench capacitors 16a and 16b and connect to other trench capacitors not shown. They are separated from the Poly-1 field plate 32 by an interlevel oxide layer 36, ILO, of thermally grown oxide. The poly-2 word lines 14 have side walls 38 of deposited nitride-2. Phosphorus N+ implant layer lies in the P tank 40, located underneath the BLO layer 30 of the bit line contacts, and also located between word line 14a of trench capacitor 16a and between word line 14b of trench capacitor 16b. Phosphorous N+ implant layer 42 forms the drain and source of the pass transistors. Underneath the poly-1 field plate 32, between the trench to trench space separating trench capacitors 16a and 16b, lies a nitride layer 44, nitride-3, about 1300 A thick. Between Nitride-3 layer 44 and P-tank 40 lies an oxide layer 46, pad ox-3, containing about 300 A of oxide. It acts as a buffer layer between the Silicon substrate 48 and the nitride-3 layer 44 and as part of the field plate isolating dielectric.

Still referring to FIGS. 2 and 3, the trench capacitors 16a and 16b extend through the P-tank 40 into the P substrate 48 of the silicon wafer, not shown. On the outside of the trench capacitor walls, is an implanted layer 50 of arsenic. Arsenic layer 50 creates the N+ storage node of the trench capacitors. The upper portion of the storage node on the top of the trench edge where the gated diode leakage current could flow into the P-tank 40 is indicated by reference numeral 51. The trench capacitor walls contain a gate dielectric 52, gate ox-1, that acts as a dielectric layer between the arsenic trench wall implant and the poly-1 field plate 32. An oxide layer covers a thin nitride layer to form the gate dielectric layer 52.

By reference to FIGS. 4–4d, this specification next describes the process for manufacturing the preferred embodiment of the above described DRAM 10 through the processing point that advantageously eliminates the gated diode leakage problem. U.S. Pat. No. 4,721,987 to Baglee et al. entitled "Trench Capacitor Process for High Density Dynamic Ram" issued Jan. 26, 1988 and assigned to Texas Instruments Incorporated describes an entire DRAM trench capacitor, field plate isolated, process flow and the following copending and coassigned applications of Texas Instruments Incorporated filed on Jul. 25, 1989, incorporated herein by reference, also fully describe process flows suitable for thereafter completing the manufacture of DRAMs having trench capacitors and field plate isolation similar to DRAM 10:

Ser. No. 385,441
Ser. No. 385,601
Ser. No. 385,328
Ser. No. 385,344; and
Ser. No. 385,340.

Referring to FIG. 4, a boron implant step creates P-tank 40 in P type silicon substrate 48. An implant step of about $6.0E12/cm^2$ boron @50 KeV suffices to increase the boron concentration in p-tank 40 for control of trench capacitance leakage and latchup. A steam/HCL oxidation step at about 900 C grows about 300 A of oxide on top of p-tank 40 to form pad oxide-3 layer 46. Pad oxide-3 layer 46 acts as a buffer between the silicon substrate 48 and nitride-3 layer 44. A deposition step of about $DCS: 10NH_3$, 200 mtorr, 800 C forms nitride-3 layer 44 to a thickness of about 1300 A on top of pad oxide-3 layer 46.

In FIG. 4a, a Phospho-Silicate Glass (PSG) deposition step of about 7.4 wt % phosphorus at 530 C creates a trench mask oxide 54 on top of nitride-3 layer 44. A trench pattern step of coating trench mask oxide layer 54 with photoresist 58, exposing and developing the photoresist 58 through the desired trench pattern next occurs.

FIG. 4b illustrates the resulting structure after a trench mask etch step and a trench etch step. The trench mask etch step etches the trench pattern of about 0.8 um by 0.8 um through PSG mask oxide layer 54, nitride-3 layer 44, and pad oxide-3 layer 46 by 100% overetch of $CHF_3/CF_4/He/Ar$ at about 900 mtorr. A trench etch step etches the trenches of about 6.0 um through P-tank 40 into P type silicon substrate 48 by RIE of $SiF_4/HBr$, at about 100 mtorr.

FIG. 4c shows the resulting structure after a trench mask strip step while FIG. 4c presents an enlarged view of the upper portion 51 of the trench wall edge. The trench mask strip step removes the PSG mask oxide layer 54 and trench wall oxide deposits by deglazing in 10% HF for about 50 seconds followed by a megasonic clean. The HF deglaze step to remove the PSG mask oxide layer 54 also etches into the pad-oxide 3 layer 46 below the nitride-3 layer 44 creating an undercut area 46u around the top of the trench. The edge of nitride layer 44 now "dips-out" over the edge of the pad oxide layer 46.

FIGS. 4d and 4d illustrate the advantageous preferred method of the invention wherein a dual angle trench wall implant step creates the n+ storage node arsenic layer 50 on the trench wall as a shallow junction. The method uses both a low angle tilt implant, represented by arrow 59, and a high angle tilt implant, represented by arrow 57 to implant arsenic into the trench wall edges. The low angle tilt implant introduces arsenic into the lower and upper portions of the trench while the high angle tilt implant introduces additional arsenic around the upper portion of the trench wall edge so that the upper portion is more heavily doped. The low angle implant occurs at approximately 6 degrees tilt with a total dose of approximately $4.0E15/cm^2$ arsenic occurring through four 90 degree rotations of about $1.0E15/cm^2$ arsenic @ 100 KeV. The high angle implant occurs at approximately 45 degrees tilt with a total dose of approximately $5.0E14/cm^2$ arsenic occurring through four 90 degree rotations of about $1 25E14/cm^2$ @ 100 KeV.

The dual angle implant trench wall step provides a large arsenic doping concentration around the top of the trench. While the lower angle implant performs well to implant arsenic into most of the edge of the trench wall, the dip-out portion of nitride-3 layer 44 overlying the undercut area 46u blocks the lower angle implanted arsenic from reaching the portion of P-tank 40 near the end of the pad oxide-3 layer 46. The higher angle implant allows the arsenic to penetrate further into the undercut area 46u, thereby putting more arsenic into the upper portion of the trench wall edge. The upper portion of the storage node is bowed, curved, and extends past the end of pad oxide-3 layer 46 in undercut area 46u. This large doping of arsenic on the upper portion of the trench wall edges extending past the end of pad oxide-3 layer 46 decreases the current leaking from the upper portion of the storage node in area 51 into the P-tank 40.

Referring back to FIG. 3, the device is further processed to yield the dynamic memory cell disclosed therein. A protective coating is added on top, (not shown) and patternred to expose bonding pads. Then the semiconductor wafer is tested, scribed and broken into individual dies, and the dies mounted in semiconductor packages.

While the 6 degree/45 degree dual angle arsenic implant is the preferred embodiment, the inventors contemplate that other dual angle combinations will increase the storage node doping concentration around the upper portion of the trench walls. One example is an 8 degree/45 degree dual angle implant step.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A dynamic memory storage capacitor formed in a face of a semiconductor body, comprising:
    a trench etched into the face of the semiconductor body, the trench having a trench wall with an upper portion and a lower portion;
    a storage region in the face of the semiconductor body surrounding the trench wall, the storage region being more highly doped near the upper portion of the trench wall than near the lower portion of the trench wall;
    a storage dielectric on the trench wall; and
    a field plate extending down into the trench.

2. The dynamic memory storage capacitor of claim 1 wherein the storage node is implanted arsenic.

3. The dynamic memory storage capacitor of claim 2 wherein the field plate is polysilicon.

4. The dynamic memory storage capacitor of claim 3 wherein the storage dielectric is oxide.

5. The dynamic memory storage capacitor of claim 3 wherein the field plate is isolated from the face in all areas except down in the trench by a layer of oxide and a layer of nitride.

6. The dynamic memory storage capacitor of claim 1 wherein the storage node comprises arsenic, implanted at more than one angle.

* * * * *